United States Patent
Ji et al.

(10) Patent No.: US 10,248,263 B2
(45) Date of Patent: Apr. 2, 2019

(54) ACOUSTIC WAVE TOUCH DEVICE AND ELECTRONIC APPARATUS

(71) Applicant: Boe Technology Group Co., Ltd., Beijing (CN)

(72) Inventors: Chuyan Ji, Beijing (CN); Wenbo Li, Beijing (CN); Tian Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 233 days.

(21) Appl. No.: 15/127,857

(22) PCT Filed: Oct. 20, 2015

(86) PCT No.: PCT/CN2015/092290
§ 371 (c)(1),
(2) Date: Sep. 21, 2016

(87) PCT Pub. No.: WO2016/192266
PCT Pub. Date: Dec. 8, 2016

(65) Prior Publication Data
US 2018/0173370 A1    Jun. 21, 2018

(30) Foreign Application Priority Data

May 29, 2015    (CN) .......................... 2015 1 0288982

(51) Int. Cl.
*G06F 3/043*        (2006.01)
*G06F 3/0488*    (2013.01)
(Continued)

(52) U.S. Cl.
CPC ............ *G06F 3/0436* (2013.01); *G06F 3/016* (2013.01); *G06F 3/043* (2013.01); *G06F 3/0433* (2013.01);
(Continued)

(58) Field of Classification Search
CPC ...... G06F 3/0433; G06F 3/0436; G06F 3/043; G06F 3/0488; H05K 7/20972
See application file for complete search history.

(56) References Cited

U.S. PATENT DOCUMENTS

2006/0139339 A1    6/2006    Pechman et al.
2007/0246707 A1    10/2007    Deng et al.
(Continued)

FOREIGN PATENT DOCUMENTS

CN    101095100    12/2007
CN    101095100 A    12/2007
(Continued)

OTHER PUBLICATIONS

International Search Report and Written Opinion from PCT/CN15/92290 dated Feb. 29, 2016.
(Continued)

*Primary Examiner* — Dmitriy Bolotin
(74) *Attorney, Agent, or Firm* — Calfee, Halter & Griswold LLP

(57)    ABSTRACT

Embodiments of the invention disclose an acoustic wave touch device and an electronic apparatus, which belong to the field of communication and display. The device comprises an acoustic wave touch module and at least one airflow generating module. The acoustic wave touch module comprises a guard plate having at least one through hole. The airflow generating module is arranged at a position to which each through hole corresponds. The acoustic wave touch module is used for generating an acoustic wave that propagates along the surface of the guard plate or passes through the guard plate, and controlling all or part of the at least one airflow generation module to generate airflow that blows to the user's finger via the through hole of the guard
(Continued)

plate when it is detected based on the acoustic wave that a user's finger touches the guard plate.

18 Claims, 3 Drawing Sheets

(51) Int. Cl.
    *G06F 3/01*     (2006.01)
    *H05K 7/20*     (2006.01)

(52) U.S. Cl.
    CPC ....... *G06F 3/0488* (2013.01); *H05K 7/20972* (2013.01)

(56) References Cited

U.S. PATENT DOCUMENTS

| | | |
|---|---|---|
| 2007/0272926 A1 | 11/2007 | Deng et al. |
| 2008/0061295 A1 | 3/2008 | Wang et al. |
| 2008/0291156 A1 | 11/2008 | Dietz et al. |
| 2011/0107958 A1 | 5/2011 | Pance et al. |
| 2011/0199342 A1 | 8/2011 | Vartanian et al. |
| 2012/0280920 A1* | 11/2012 | Jackson .................. G06F 3/016 345/173 |
| 2013/0113760 A1* | 5/2013 | Gossweiler ............. G06F 3/016 345/177 |
| 2014/0306937 A1 | 10/2014 | Lim |
| 2015/0199011 A1* | 7/2015 | Fukumoto ............... G06F 3/016 345/173 |

FOREIGN PATENT DOCUMENTS

| | | |
|---|---|---|
| CN | 101127357 | 2/2008 |
| CN | 101149541 | 3/2008 |
| CN | 101149546 | 3/2008 |
| CN | 101180600 | 5/2008 |
| CN | 201673484 | 12/2010 |
| CN | 201673484 U | 12/2010 |
| CN | 102812413 | 12/2012 |
| CN | 102812413 A | 12/2012 |
| CN | 104850279 | 8/2015 |
| JP | 5317706 B2 | 10/2013 |
| JP | 2014099073 A | 5/2014 |

OTHER PUBLICATIONS

First Office Action for Chinese Patent Application No. 201510288982.3 dated Jun. 5, 2017.

Search Report from European Patent Application No. 15884173.4 dated Dec. 13, 2018.

* cited by examiner

ACOUSTIC WAVE TOUCH DEVICE AND ELECTRONIC APPARATUS

RELATED APPLICATIONS

The present application is the U.S. national phase entry of PCT/CN2015/092290, with an international filling date of Oct. 20, 2015, which claims the benefit of Chinese Patent Application NO. 201510288982.3, filed on May 29, 2015, the entire disclosure of which is incorporated herein by reference.

FIELD OF THE INVENTION

Embodiments of the invention relate to the field of communication and display, and particularly to an acoustic wave touch device and an electronic apparatus.

BACKGROUND

The acoustic wave touch screen technology provides a new way of human-machine interactive input. It greatly facilitates the interaction between a user and the terminal as compared to the traditional input ways by means of a keyplate and mouse.

Current acoustic wave touch screen technology is to arrange an acoustic wave generator and an acoustic wave receiver in the periphery of the terminal screen. The acoustic wave generator is capable of transmitting a high frequency acoustic wave across the screen surface. When a finger touches the screen, the acoustic wave at the touch point is blocked. The coordinate position of the touch point can be determined by detecting the position to which the change in the acoustic wave corresponds. Respective operations may be performed based on the coordinate position of the touch point so as to enable the interaction between the user and the terminal.

The inventor discovers that the prior art at least involves the following problem: sometimes, when the user touches the terminal screen, the user may consider the touch to be unsuccessful before the terminal could respond to the user's touch operation and further touches the screen one or more times, but multiple successive touches may lead to misoperation of the terminal.

SUMMARY

To alleviate or avoid the abovementioned problem, embodiments of the invention provide an acoustic wave touch device and an electronic apparatus.

The acoustic wave touch device may comprise an acoustic wave touch module and at least one airflow generating module. The acoustic wave touch module comprises a guard plate having at least one through hole, and the at least one airflow generating module is positioned to correspond to the least one through hole. The acoustic wave touch module is used for generating an acoustic wave that propagates along a surface of the guard plate or passes through the guard plate, and controlling all or part of the at least one airflow generation modules to generate airflow that blows to a user's finger via the through hole of the guard plate when it is detected that the user's finger touches the guard plate based on the acoustic wave.

In an embodiment, the acoustic wave touch module comprises a display panel parallel to the guard plate, and the airflow generating module is arranged within a projection region of its corresponding through hole on the display panel.

In an embodiment, the acoustic wave touch module is used for acquiring a touch region of the guard plate touched by the user's finger when it is detected that the user's finger touches the guard plate, and controlling the airflow generating modules to which the through holes within the touch region correspond to generate airflow that blows to the user's finger via the through holes.

In an embodiment, the acoustic wave touch module is used for acquiring a pressure on the guard plate resulting from a press of the user's finger when it is detected that the user's finger touches the guard plate, and determining a power for generating airflow based on the pressure, then controlling all or part of the at least one airflow generating module to generate airflow based on the power.

In an embodiment, the acoustic wave touch module comprises an acoustic wave module corresponding to each of the at least one through holes that incorporates an acoustic wave generator and an acoustic wave receiver, the acoustic wave module corresponding to each through hole is arranged in the projection region corresponding to each through hole.

In an embodiment, the acoustic wave module and the airflow generating module located in a same projection region are arranged in a staggered manner or an overlapping manner.

In an embodiment, when the acoustic wave module and the airflow generating module are arranged in an overlapping manner, an area of an airflow outlet of the airflow generating module is larger than that of the acoustic wave module.

In an embodiment, the acoustic wave touch module is used for acquiring a time when the user's finger touches the guard plate, determining a time period based on the time, and controlling all or part of the at least one airflow generating module to generate airflow within the time period.

In an embodiment, the acoustic wave touch module stops generating the acoustic wave before the airflow generating module generates airflow.

In an embodiment, the acoustic wave touch module comprises at least one acoustic wave generator, the at least one acoustic wave generator being arranged in a periphery of the guard plate.

A further embodiment of the invention provides an electronic apparatus, which may comprise the acoustic wave touch device described in any embodiment of the above embodiments.

With the embodiments of the invention, since the acoustic wave touch device comprises an airflow generating module, when the acoustic wave touch module detects that the user's finger touches the guard plate, all or part of the at least one airflow generating module is controlled to generate airflow that may blow to the user's finger via the through hole of the guard plate. In this way, the airflow may prompt the user that the touch is successful so as to avoid multiple touches which would result in misoperation of the terminal.

BRIEF DESCRIPTION OF THE DRAWINGS

FIG. 2-1 is a structural schematic view of an acoustic wave touch device provided by another embodiment of the invention;

FIG. 2-2 is a top view of an acoustic wave touch module provided by an embodiment of the invention;

FIG. 2-3 is a top view of an acoustic wave touch module provided by a further embodiment of the invention;

FIG. 2-4 is a structural schematic view of an acoustic wave touch device provided by an embodiment of the invention in which the airflow generating module and the acoustic wave generator are arranged in an overlapping manner;

FIG. 3 provides a top view of an acoustic wave touch device according to another embodiment of the invention;

FIG. 4 provides a structural schematic view of an acoustic wave touch device according to a further embodiment of the invention.

DETAILED DESCRIPTION OF EMBODIMENTS

To make the object, technical solutions and advantages of the invention clearer, embodiments of the invention will be further described in detail below with reference to the drawings.

Figure 1:
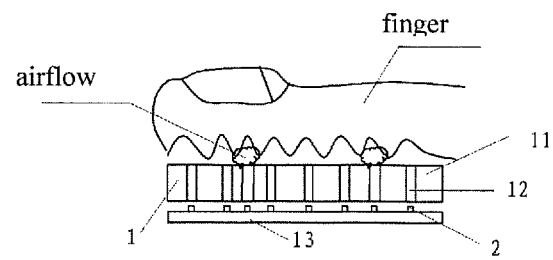
FIG. 1 is a structural schematic view of an acoustic wave touch device provided by an embodiment of the invention.

Referring to FIG. 1, an embodiment of the invention provides an acoustic wave touch device. The acoustic wave touch device may be installed on a terminal to act as an input device of the terminal. The acoustic wave touch device comprises an acoustic wave touch module 1 and at least one airflow generating module 2.

The acoustic wave touch module 1 comprises a guard plate 11 having at least one through hole 12. An airflow generating module of the at least one airflow generating module 2 is provided at a position to which each through hole 12 corresponds. For example, one or more airflow generating modules 2 may be arranged under each through hole.

The acoustic wave touch module 1 may generate an acoustic wave that propagates along the surface of the guard plate 11. When it is detected based on the acoustic wave that a user's finger touches the guard plate 11, the acoustic wave touch module 1 may control all or part of the at least one airflow generation module 2 to generate an airflow that may blow to the user's finger via the through hole 12 of the guard plate.

With the embodiment of the invention, since the acoustic wave touch device comprises an airflow generating device, all or part of the at least one airflow generating module are controlled to generate an airflow which may blow to the user's finger via the through hole of the guard plate when the acoustic wave touch module detects that the user's finger touches the guard plate, thus, the airflow may prompt the user that the touch is successful so as to avoid multiple touches which would result in misoperation of the terminal.

The acoustic wave touch device according to the embodiment of the invention may further comprise a controller, an acoustic wave generator and an acoustic wave receiver (not shown in FIG. 1). The acoustic wave generator may be a transmitting transducer capable of receiving an electrical signal from the controller and converting the electrical signal into acoustic energy. The acoustic wave receiver may be a receiving transducer capable of receiving the acoustic energy transmitted by the acoustic wave generator and converting it into an electrical signal to be provided to the controller. When the user's finger touches the surface of the acoustic wave touch device, the acoustic energy passing by the finger would partially be absorbed, which may form an attenuation gap on the waveform of the feedback signal received by the acoustic wave receivers. The controller may determine the horizontal coordinate and the longitudinal coordinate of the touch point based on the position of this gap, thereby determining the position of the touch point on the touch panel of the acoustic wave touch device. As regards the embodiment shown in FIG. 1, the acoustic wave generator, the acoustic wave receiver and the controller may be included in the acoustic wave touch module 1. The acoustic wave generator, the acoustic wave receiver and the controller are well known to those skilled in the art, the structures and principle of which are not further discussed here in detail. It is to be understood that any suitable device capable of generating an airflow which is known to those skilled in the art may be used as the airflow generating module. For example, the airflow generating module 2 may include but is not limited to an air pump. In an embodiment of the invention, a micro electrical air pump may be utilized. As is known to those skilled in the art, the electrical air pump may expel air by means of, for example, electric energy from the terminal. In an embodiment, a micro air pump manufactured by nano technology may be used as the airflow generating module. For example, the size of the air pump may be determined such that it corresponds to the dimension of the through hole in the guard plate, so as to enable the air expelled by the air pump to arrive at the through hole in the guard plate with ease. Manufacturing a micro device (e.g. nano motor, etc) by using nano technology is known to those skilled in the art, which is not the concern of the invention and not further discussed here in detail.

Figures 1, 2:
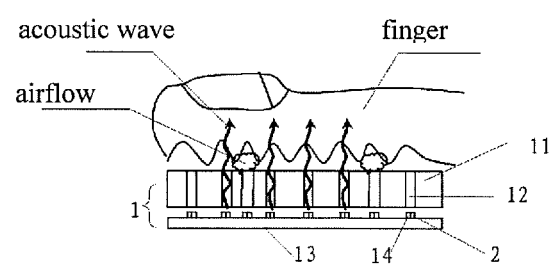
Figure 2:
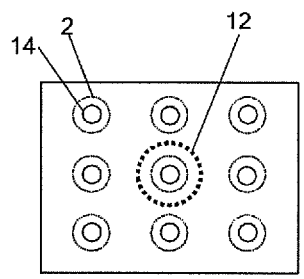

Referring to FIG. 2-1, it illustrates an acoustic wave touch device provided by another embodiment of the invention.

The acoustic wave touch device comprises an acoustic wave touch module 1 and at least one airflow generating module 2. The acoustic wave touch module 1 comprises a guard plate 11, a display panel 13 and at least one acoustic wave module 14 incorporating an acoustic wave generator and an acoustic wave receiver. The guard plate 11 comprises at least one through hole 12. The guard plate 11 and the display panel 13 are arranged in parallel. The projection region of each through hole 12 in the guard plate 11 on the display panel 13 is provided with an airflow generating module 2 of the at least one airflow generating module and an acoustic wave module 14 of the at least one acoustic wave module. For example, one or more airflow generating modules 2 and one or more acoustic wave modules 14 may be arranged under each through hole.

The acoustic wave touch module 1 may control the acoustic wave generator in the at least one acoustic wave module 14 to generate an acoustic wave which may pass through the through hole 12 of the guard plate 11. When it is detected that the user's finger touches the guard plate 11 based on the acoustic wave, the acoustic wave touch module may control all or part of the at least one airflow generating module 2 to generate an airflow that may blow to the user's finger via the through hole 12 in the guard plate 11.

In this embodiment, the through holes 12 may be uniformly distributed in the entire guard plate 11. Accordingly, the airflow generating modules 2 and the acoustic wave modules 14 below the guard plate 11 may also uniformly distributed on the display panel 13. In an embodiment, one airflow generating module 2 and one acoustic wave module 14 may be arranged directly below each through hole 12 in the guard plate 11.

Referring to FIG. 2-1, the acoustic wave module 14 below each through hole 12 may generate an acoustic wave. The acoustic wave may propagate upwards along the through hole 12. When the user's finger touches the guard plate 11, the user's finger would reflect part of the acoustic wave generated by the acoustic wave module 14 to form a reflected wave. The reflected wave may pass through the through hole 12 and be received by the acoustic wave receiver in the acoustic wave module 14. The acoustic wave touch module 1 may acquire the positions of one or more acoustic wave modules 14 that have received the reflected wave, and determine the touch region on the guard plate 11 where the user's finger touches the guard plate 11 based on the acquired positions of the acoustic wave modules.

For example, suppose that the acoustic wave module 14 that receives the reflected wave from the user's finger comprises acoustic wave modules A, B, C and D, and suppose that the coordinate positions for the acoustic wave modules A, B, C and D are (1,1), (1,3), (3,1) and (3,3), respectively, it can be determined based on the positions of the acoustic waves A, B, C and D that the horizontal coordinate of the touch region of the guard plate 11 touched by the user's finger ranges from 1 to 3, and the longitudinal coordinate thereof ranges from 1 to 3.

In accordance with another embodiment of the invention, the acoustic wave touch module 1 may determine the touch region of the guard plate 11 touched by the user's finger when it is detected that the user's finger touches the guard plate 11, and control the airflow generating modules 2 to which the through holes 12 within the touch region correspond to generate airflow. The generated airflow may blow to the user's finger via the through holes 12 within the touch region. Controlling only the airflow generating modules 2 to which the through holes 12 within the touch region correspond to generate airflow may save electric energy as compared to controlling all the airflow generating modules 2 to generate airflow.

In a further embodiment, the acoustic wave touch module 1 may acquire a pressure on the guard plate 11 resulting from the press of the user's finger, and determine a power for generating airflow based on the pressure. Then the acoustic wave touch module may control all or part of the at least one airflow generating module 2 to generate an airflow based on the determined power. In an embodiment, the acoustic wave touch module 1 may control, based on the power, the airflow generating modules 2 to which the through holes 12 within the touch region correspond to generate airflow. It can be understood that, as the force applied by the user's finger on the guard plate 11 increases, the attenuation gap on the waveform of the feedback signals received by the acoustic wave receivers in the acoustic wave touch device becomes deeper, or the signal of the reflected wave from the finger becomes stronger, based on which the controller may determine the magnitude of the pressure.

In an embodiment, it is possible to configure in the acoustic wave touch module 1 correspondences between a pressure range and the power in advance. Accordingly, the acoustic wave touch module 1 may determine the power for generating an airflow according to the steps below comprising: determining a pressure range within which the acquired pressure falls, acquiring a corresponding power from the correspondences between the pressure range and power based on the determined pressure range, and using the acquired power as the power for generating an airflow.

Determining the power for generating an airflow based on the pressure on the guard plate 11 resulting from the user's press may ensure that as the pressure resulting from the user's press increases, the acting force to the user's finger by the airflow generated by the airflow generating module 2 may become larger, which enables the user to feel that the larger the pressure on the guard plate 11 resulting from the user's press is, the larger the acting force fed back from the guard plate 11 will be, thereby improving the user's interaction experience.

In a further embodiment, the acoustic wave touch module 1 may acquire a time when the user's finger touches the guard plate 11, determine a time period based on the time, and control all or part of the at least one airflow generating module 2 to generate airflow within the time period.

For example, a time length may be preset in advance, and the acoustic wave touch module 1 may determine a time period based on the acquired time and the preset time length. Controlling the airflow generating module 2 to generate airflow within this time period and stop generating airflow at the end of the time period may save the electric energy consumption of the terminal.

In another embodiment, the acoustic wave touch module 1 may further control the acoustic wave generator to stop generating an acoustic wave before the airflow generating module 2 generates airflow. That is, the acoustic wave touch module 1 controls the acoustic wave generator to stop generating an acoustic wave in the time period during which the airflow generating module 2 generates airflow. In this embodiment, the acoustic wave touch module 1 may control the acoustic wave generator to stop generating an acoustic wave in this time period and again control the acoustic wave generator to generate an acoustic wave at the end of this time period. Controlling the acoustic wave generator to stop generating the acoustic wave within this time period can reduce the impact on the airflow generating module generating airflow.

Figures 2, 3:
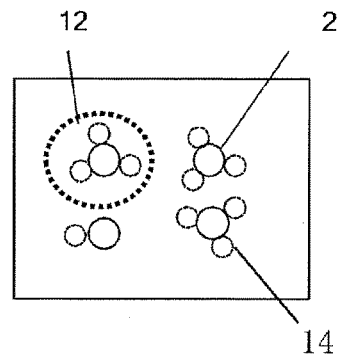
Figures 2, 3, 4:
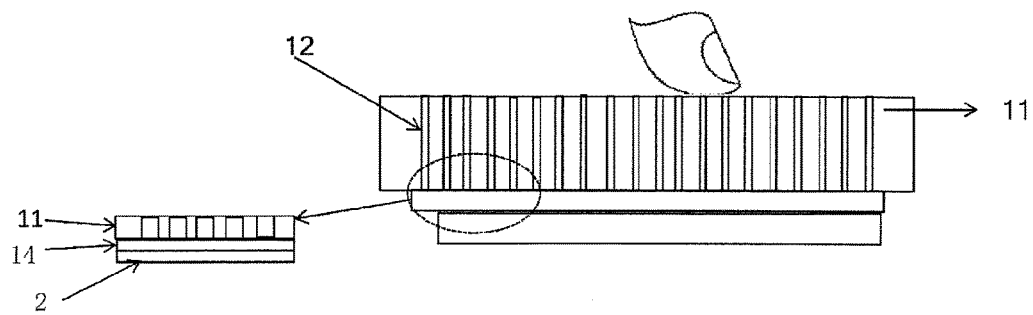
Figure 3:
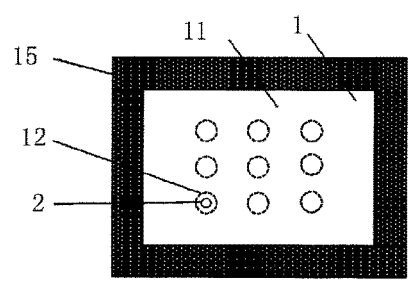
Figure 4:
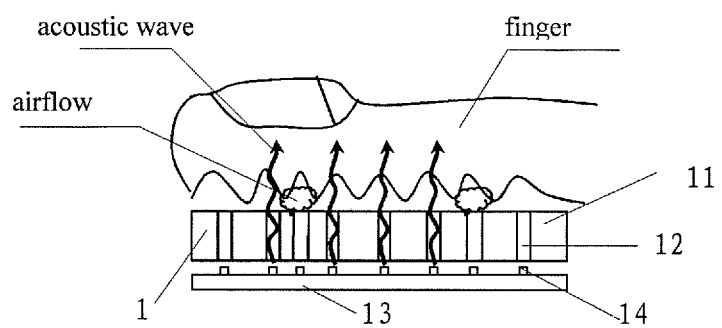

FIGS. 2-2 and 2-3 illustrate a top view of an acoustic wave touch device according to an embodiment of the invention. Referring to FIG. 2-2, within one and the same projection region, the airflow generating module 2 may overlap with the acoustic wave module 14. The acoustic wave module 14 may be located between the through hole 12 and the airflow generating module 2, and the area of the airflow outlet of the airflow generating module 2 may be larger than that of the acoustic wave module 14. Referring to FIG. 2-4, in this embodiment, in case the airflow generating module 2 and the acoustic wave module 14 are arranged in an overlapping manner, the acoustic wave touch device comprises, from the top down, a guard plate 11, an acoustic wave module 14, an airflow generating module 2 and a display panel 13 (not shown) in succession. Since the area of the airflow outlet of the airflow generating module 2 is larger than that of the acoustic wave module 14, the airflow can arrive at the through hole 12. Alternatively, referring to FIG. 2-3, within one and the same projection region, the airflow generating module 2 and the acoustic wave module 14 may be arranged in a staggered manner. In this case, the acoustic wave module 14 and the airflow generating module 2 may be located in the same layer, and the acoustic wave touch device may comprise, from the top down, a guard plate 11, an acoustic wave module 14 and an airflow generating module 2 located in the same layer, and a display panel 13 in succession.

In the embodiment in which the acoustic wave module 14 and the airflow generating module 2 are located between the guard plate 11 and the display panel 13, the acoustic wave module 14 and the airflow generating module 2 may be made from transparent materials such that they are transparent. This may reduce the impact on the display panel displaying images.

With the above embodiments, since the acoustic wave touch device comprises an airflow generating module, when the acoustic wave touch module detects that the user's finger touches the guard plate, all or part of the at least one airflow generating module are controlled to generate airflow, which may blow to the user's finger via the through hole of the guard plate. In this way, the airflow may prompt the user that the touch is successful so as to avoid multiple touches which would result in misoperation of the terminal.

FIG. 3 provides a top view of an acoustic wave touch device according to another embodiment of the invention.

The acoustic wave touch device may comprise an acoustic wave touch module 1 and at least one airflow generating module 2. The acoustic wave touch module 1 comprises a guard plate 11, a display panel 13 (not shown in the figure) and at least one acoustic wave generator 15. The guard plate 11 comprises at least one through hole 12.

The guard plate 11 and the display panel 13 are arranged in parallel. The projection region of each through hole 12 in the guard plate 11 on the display panel is provided with an airflow generating module of the at least one airflow generating module 2. The at least one acoustic wave generator 15 is arranged in the periphery of the guard plate 11.

The acoustic wave touch module 1 may control the at least one acoustic wave generator 15 to generate an acoustic wave. The acoustic wave may propagate along the surface of the guard plate 11. When it is detected based on the acoustic wave that the user's finger touches the guard plate 11, the acoustic wave touch module 1 controls all or part of the at least one airflow generating module 2 to generate airflow that may blow to the user's finger via the through hole 12 in the guard plate 11.

In this embodiment, the through holes 12 in the guard plate 11 may be uniformly distributed in the entire guard plate 11. Accordingly, the airflow generating modules 2 below the guard plate 11 may also be uniformly distributed on the display panel 13. As stated above, the acoustic wave touch device may further comprise an acoustic wave receiver and a controller (not shown) which are known to those skilled in the art. The controller may emit an electric signal to trigger the acoustic wave generator 15 to generate acoustic energy. The controller may further receive a feedback signal from the acoustic wave receiver and determine the touch position for the user based on the feedback signal. These are known to those skilled in the art and not discussed here in detail.

Referring to FIG. 3, the acoustic wave generators 15 located in the periphery of the guard plate 11 may generate acoustic waves. The acoustic waves may propagate along the surface of the guard plate 11. The acoustic waves generated by the acoustic wave generators 15 on one side would be received by the acoustic wave receivers (not shown in the figure) located on the opposite side. When the user's finger touches the guard plate, the user's finger would block the propagation of the acoustic waves generated by the acoustic wave generators 15 along the surface of the guard plate 11, thereby forming an attenuation gap corresponding to the touch position by the user on the waveform of the feedback signal received by the acoustic wave receiver. Consequently, the touch region on the guard plate 11 touched by the user's finger may be determined.

In another embodiment, the acoustic wave touch module 1 may acquire the touch region of the guard plate 11 touched by the user's finger when it is detected that the user's finger touches the guard plate 11, and control the airflow generating modules 2 to which the through holes 12 within the touch region correspond to generate airflow. The generated airflow may blow to the user's finger via the through holes 12 within the touch region. Controlling only the airflow generating modules 2 to which the through holes 12 within the touch region correspond to generate airflow may save electric energy as compared to controlling all the airflow generating modules 2 to generate airflow.

In another embodiment, the acoustic wave touch module 1 may acquire a pressure on the guard plate 11 resulting from the press of the user's finger, and determine a power for generating airflow based on the pressure. Then the acoustic wave touch module may control all or part of the at least one airflow generating module 2 to generate airflow based on the determined power. Further, the acoustic wave touch module 1 may control, based on the power, the airflow generating modules 2 to which the through holes 12 within the touch region correspond to generate airflow.

In an embodiment, it is possible to enable the acoustic wave touch module 1 to configure correspondences between a pressure range and power in advance. Accordingly, the acoustic wave touch module 1 may determine the power for generating an airflow according to the steps below comprising: determining a pressure range within which the acquired pressure falls, acquiring a corresponding power from the correspondences between the pressure range and power based on the determined pressure range, and using the acquired power as the power for generating an airflow.

In this embodiment, by determining the power for generating airflow based on the pressure on the guard plate 11 resulting from the user's press, it may be ensured that as the pressure resulting from the user's press increases, the acting force to the user's finger by the airflow generated by the airflow generating module 2 may become larger, which enables the user to feel that the larger the pressure on the guard plate 11 resulting from the user's press is, the larger the acting force fed back from the guard plate 11 is, thereby improving the user's interaction experience.

In a further embodiment, the acoustic wave touch module 1 may acquire a time when the user's finger touches the guard plate 11, determine a time period based on the time, and control all or part of the at least one airflow generating module 2 to generate airflow within the time period. By controlling the airflow generating module 2 to generate airflow within this time period and stop generating airflow at the end of the time period, the electric energy consumption of the terminal may be saved.

In a further embodiment, the acoustic wave touch module 1 may further control the acoustic wave generator 14 to stop generating an acoustic wave in this time period and again controls the acoustic wave generator 14 to generate an acoustic wave at the end of this time period. Controlling the acoustic wave generator 14 to stop generating the acoustic wave within this time period can reduce the impact on the airflow generating module generating airflow.

In the above embodiments, since the acoustic wave touch device comprises an airflow generating module, when the acoustic wave touch module detects that the user's finger touches the guard plate, all or part of the at least one airflow generating module are controlled to generate airflow, which may blow to the user's finger via the through hole of the guard plate. In this way, the airflow can prompt the user that the touch is successful so as to avoid multiple touches which would result in misoperation of the terminal. Moreover, the acoustic wave generators may be arranged in the periphery of the guard plate, which may reduce or avoid the impact by the acoustic wave generator to the airflow generating module blowing the airflow.

FIG. 4 illustrates an acoustic wave touch device according to a further embodiment of the invention. In this embodiment, the acoustic wave touch device may comprise an acoustic wave touch module 1, a display panel 13 and a plurality of acoustic wave modules 14 incorporating an acoustic wave generator and an acoustic wave receiver. The acoustic wave touch module 1 at least comprises a guard plate 11 having at least one through hole 12. The acoustic wave module 14 may be arranged on the display panel 13 and correspond to the position of each through hole in the guard plate 11. When it is detected based on the acoustic wave generated by the acoustic wave generator that the user's finger touches the guard plate 11, the acoustic wave touch module 1 may control the acoustic wave generator in the acoustic wave module 14 corresponding to the touch position by the user's finger to generate a stronger acoustic wave signal than the acoustic wave generators at other positions. Therefore, such stronger acoustic wave signal may produce relatively strong airflow turbulence, and such strong airflow turbulence may reach the user's finger via the through hole 12. In this manner, the airflow may prompt the user that the touch is successful so as to avoid multiple touches which would result in misoperation of the terminal.

For example, the acoustic wave touch module 1 may further comprise a controller (not shown). The controller may provide an electric signal to the acoustic wave generator in the acoustic wave module 14. Upon receiving the electric signal, the acoustic wave generator converts the electric signal into acoustic energy. Therefore, the acoustic wave module 14 under each through hole 12 can generate an acoustic wave. The acoustic wave may propagate upwards along the through hole 12. When the user's finger touches the guard plate 11, the user's finger would reflect part of the acoustic wave generated by the acoustic wave module 14 to form a reflected wave. The reflected wave may pass through the through hole 12 and be received by the acoustic wave receiver in the acoustic wave module 14. The controller in the acoustic wave touch module 1 can determine the positions of one or more acoustic wave modules 14 that receive the reflected wave. The touch region of the guard plate 11 touched by the user's finger may be determined based on the determined positions of the acoustic wave modules 14.

On such basis, the controller may provide a stronger electric signal to the acoustic wave generator in the acoustic wave module 14 corresponding to the determined position, thereby controlling the acoustic wave generator in the acoustic wave module 14 corresponding to the touch position by the user's finger to generate a stronger acoustic wave signal than the acoustic wave generators at other positions. Such stronger acoustic wave signal may produce stronger airflow turbulence, which may reach the user's finger via the through hole 12. In this manner, the airflow may prompt the user that the touch is successful so as to avoid multiple touches by the user which would result in misoperation of the terminal. Therefore, this embodiment of the invention provides a solution of providing an indication of successful touch to the user without the need of an airflow generating module. Moreover, it may be appreciated that in an alternative embodiment, a blind hole can be used in place of the through hole 12 shown in FIG. 4, that is, the hole 12 may be disposed as not penetrating the guard plate 11.

An embodiment of the invention further provides an electronic apparatus. The electronic apparatus may comprise the acoustic wave touch device described in any embodiment of the above embodiments. Such electronic apparatus includes but is not limited to various apparatuses such as mobile phone, desk-top computer, tablet computer, notebook, personal digital assistant, and so on. Those ordinarily skilled in the art can understand that all or partial steps that implement the above embodiments may be carried out by hardware, and can also be carried out by related hardware as instructed by programs. The programs can be stored in a computer-readable storage medium. The abovementioned storage medium may be a read-only memory, magnetic disc or optical disc, etc.

What have been stated above are just some embodiments of the invention, which are not intended to limit the invention. Any amendment, equivalent substitution, improvement, etc made within the spirit and principle of the invention should be encompassed within the protection scope of the invention.

The invention claimed is:

1. An acoustic wave touch device, comprising:
an acoustic wave touch module; and
at least one airflow generating module,
wherein the acoustic wave touch module comprises a guard plate having at least one through hole, and the at least one airflow generating module is positioned to correspond to the at least one through hole,
wherein the acoustic wave touch module is used for generating an acoustic wave that propagates along a surface of the guard plate or passes through the guard plate, and controlling all or part of the at least one airflow generation modules to generate airflow that blows to a user's finger via the through hole of the guard plate when it is detected that the user's finger touches the guard plate based on the acoustic wave,
wherein the acoustic wave touch module comprises an acoustic wave module corresponding to each of the at least one through holes that incorporates an acoustic wave generator and an acoustic wave receiver, and the acoustic wave module is below each of the at least one through holes.

2. The acoustic wave touch device according to claim 1, wherein the acoustic wave touch module comprises a display panel parallel to the guard plate, and wherein the airflow generating module is arranged within a projection region of its corresponding through hole on the display panel, wherein the acoustic wave module corresponding to each through hole is arranged in the projection region corresponding to each through hole.

3. The acoustic wave touch device according to claim 2, wherein the acoustic wave module and the airflow generating module located in a same projection region are arranged in a staggered manner or an overlapping manner.

4. The acoustic wave touch device according to claim 3, wherein when the acoustic wave module and the airflow generating module are arranged in an overlapping manner, and wherein an area of an airflow outlet of the airflow generating module is larger than that of the acoustic wave module.

5. The acoustic wave touch device according to claim 2, wherein the acoustic wave touch module is used for acquiring a touch region of the guard plate touched by the user's finger when it is detected that the user's finger touches the guard plate, and controlling the airflow generating modules to which the through holes within the touch region correspond to generate airflow that blows to the user's finger via the through holes.

6. The acoustic wave touch device according to claim 2, wherein the acoustic wave touch module is used for acquiring a pressure on the guard plate resulting from a press of the user's finger when it is detected that the user's finger touches the guard plate, and determining a power for generating airflow based on the pressure, then controlling all or part of the at least one airflow generating module to generate airflow based on the power.

7. The acoustic wave touch device according to claim 2, wherein the acoustic wave touch module comprises at least one acoustic wave generators, the at least one acoustic wave generators being arranged in a periphery of the guard plate.

8. The acoustic wave touch device according to claim 1, wherein the acoustic wave touch module is used for acquiring a touch region of the guard plate touched by the user's finger when it is detected that the user's finger touches the guard plate, and controlling the airflow generating modules to which the through holes within the touch region correspond to generate airflow that blows to the user's finger via the through holes.

9. The acoustic wave touch device according to claim 1, wherein the acoustic wave touch module is used for acquiring a time when the user's finger touches the guard plate, determining a time period based on the time, and controlling all or part of the at least one airflow generating module to generate airflow within the time period.

10. The acoustic wave touch device according to claim 9, wherein the acoustic wave touch module stops generating the acoustic wave before the airflow generating module generates airflow.

11. An acoustic wave touch device, comprising:
an acoustic wave touch module; and
at least one airflow generating module,
wherein the acoustic wave touch module comprises a guard plate having at least one through hole, and the at least one airflow generating module is positioned to correspond to the at least one through hole,
wherein the acoustic wave touch module is used for generating an acoustic wave that propagates along a surface of the guard plate or passes through the guard plate, and controlling all or part of the at least one airflow generation modules to generate airflow that blows to a user's finger via the through hole of the guard plate when it is detected that the user's finger touches the guard plate based on the acoustic wave, wherein the acoustic wave touch module is used for acquiring a pressure on the guard plate resulting from a press of the user's finger when it is detected that the user's finger touches the guard plate, and determining a power for generating airflow based on the pressure, then controlling all or part of the at least one airflow generating module to generate airflow based on the power.

12. The acoustic wave touch device according to claim 11, wherein the acoustic wave touch module comprises at least one acoustic wave generator, the at least one acoustic wave generator being arranged in a periphery of the guard plate.

13. An electronic apparatus comprising the acoustic wave touch device as defined in claim 11.

14. An electronic apparatus comprising an acoustic wave touch device, the acoustic wave touch device comprising an acoustic wave touch module and at least one airflow generating module,
wherein the acoustic wave touch module comprises a guard plate having at least one through hole, and wherein the at least one airflow generating module is positioned to correspond to the at least one through hole,
wherein the acoustic wave touch module is used for generating an acoustic wave that propagates along a surface of the guard plate or passes through the guard plate, and controlling all or part of the at least one airflow generation modules to generate airflow that blows to a user's finger via the through hole of the guard plate when it is detected that the user's finger touches the guard plate based on the acoustic wave,
wherein the acoustic wave touch module comprises an acoustic wave module corresponding to each of the at least one through holes that incorporates an acoustic wave generator and an acoustic wave receiver, and the acoustic wave module is below each of the at least one through holes.

15. The electronic apparatus according to claim 14, wherein the acoustic wave touch module comprises a display panel parallel to the guard plate, and wherein the airflow generating module is arranged within a projection region of its corresponding through hole on the display panel,
wherein the acoustic wave module corresponding to each through hole is arranged in the projection region corresponding to each through hole.

16. The electronic apparatus according to claim 15, wherein the acoustic wave touch module is used for acquiring a touch region of the guard plate touched by the user's finger when it is detected that the user's finger touches the guard plate, and controlling the airflow generating modules to which the through holes within the touch region correspond to generate airflow that blows to the user's finger via the through holes.

17. The electronic apparatus according to claim 15, wherein the acoustic wave module and the airflow generating module located in a same projection region are arranged in a staggered manner or an overlapping manner.

18. The electronic apparatus according to claim 17, wherein when the acoustic wave module and the airflow generating module are arranged in an overlapping manner, an area of an airflow outlet of the airflow generating module is larger than that of the acoustic wave module.

* * * * *